(12) United States Patent
Tokunaga (10) Patent No.: US 12,394,649 B2
(45) Date of Patent: Aug. 19, 2025

(54) SEMICONDUCTOR MANUFACTURING APPARATUS FOR IMPROVED UNIFORMITY OF SEMICONDUCTOR COATING WITH TRANSFER ARM AND POSITION DETECTOR WORKING IN COMBINATION

(71) Applicant: Kioxia Corporation, Tokyo (JP)

(72) Inventor: Junji Tokunaga, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 671 days.

(21) Appl. No.: 17/409,127

(22) Filed: Aug. 23, 2021

(65) Prior Publication Data

US 2022/0108904 A1 Apr. 7, 2022

(30) Foreign Application Priority Data

Oct. 5, 2020 (JP) .................... 2020-168342

(51) Int. Cl.
*H01L 21/677* (2006.01)
*H01L 21/027* (2006.01)
(Continued)

(52) U.S. Cl.
CPC ...... *H01L 21/67706* (2013.01); *H01L 21/027* (2013.01); *H01L 21/6715* (2013.01); *H01L 21/681* (2013.01); *H01L 21/68707* (2013.01)

(58) Field of Classification Search
CPC ........ B25J 9/1664; B25J 9/1697; B25J 13/08; B25J 19/021; B25J 9/1692;
(Continued)

(56) References Cited

U.S. PATENT DOCUMENTS 5,604,443 A * 2/1997 Kitamura ........... G01R 31/2831
 414/940
5,783,834 A * 7/1998 Shatas ............... H01L 21/67778
 414/941
(Continued)

FOREIGN PATENT DOCUMENTS

CN 102479736 A 5/2012
CN 106992137 A 7/2017
(Continued)

*Primary Examiner* — Karl Kurple
(74) *Attorney, Agent, or Firm* — Foley & Lardner LLP (57) ABSTRACT

A semiconductor manufacturing apparatus includes a substrate storage unit configured to store a semiconductor wafer W, a substrate processing unit including a rotation holding unit configured to rotate the semiconductor wafer W while holding the semiconductor wafer W, and a coating liquid supply unit configured to supply a coating liquid onto the semiconductor wafer W, a substrate transfer unit including a transfer arm configured to take out the semiconductor wafer W and transfer the semiconductor water W to the rotation holding unit, and a moving mechanism configured to move the transfer arm, and a position detection unit configured to detect the position of the transfer arm. The moving mechanism moves the transfer arm onto the rotation holding unit while correcting the position of the transfer arm based on the position detection result of the transfer arm by the position detection unit.

5 Claims, 6 Drawing Sheets

(51) Int. Cl.
*H01L 21/67* (2006.01)
*H01L 21/68* (2006.01)
*H01L 21/687* (2006.01)

(58) Field of Classification Search
CPC ............. H01L 21/67742; H01L 21/681; H01L 21/68707; H01L 21/68785; G05B 2219/45031
USPC ...................................... 700/259; 901/14, 30
See application file for complete search history.

(56) References Cited

U.S. PATENT DOCUMENTS

| | | | | |
|---|---|---|---|---|
| RE37,470 E | * | 12/2001 | Ohkura | ............. H01L 21/68707 414/940 |
| 6,671,576 B1 | * | 12/2003 | Chen | ................ H01L 21/67259 700/218 |
| 6,934,606 B1 | * | 8/2005 | Genetti | ................ H01L 21/681 118/712 |
| 9,002,515 B2 | * | 4/2015 | Hornung | ............... A61B 6/4441 378/207 |
| 10,112,205 B2 | | 10/2018 | Inagaki | |
| 10,914,005 B2 | * | 2/2021 | Yahata | ................ C23C 16/4412 |
| 11,629,406 B2 | * | 4/2023 | Verghese | .......... C23C 16/45544 118/666 |
| 12,131,922 B1 | * | 10/2024 | Bibl | ......................... G01D 5/39 |
| 2003/0198376 A1 | * | 10/2003 | Sadighi | ................. B25J 9/1697 382/153 |
| 2007/0004058 A1 | * | 1/2007 | Lee | ....................... H01L 21/681 438/14 |
| 2009/0252580 A1 | * | 10/2009 | Takizawa | .......... H01L 21/68707 414/806 |
| 2011/0125325 A1 | * | 5/2011 | Fujii | ...................... B25J 9/1692 901/3 |
| 2012/0135148 A1 | | 5/2012 | Deguchi et al. | |
| 2012/0173021 A1 | * | 7/2012 | Tsusaka | ................... B25J 13/08 901/46 |
| 2014/0023776 A1 | * | 1/2014 | Kuwahara | .......... H01L 21/67259 118/697 |
| 2015/0266183 A1 | * | 9/2015 | Alifragkis | .............. B25J 9/1692 700/254 |
| 2016/0023356 A1 | | 1/2016 | Hara | |
| 2016/0340125 A1 | * | 11/2016 | Møller | ................. B65G 39/025 |
| 2017/0162421 A1 | | 6/2017 | Sakaue et al. | |
| 2017/0287761 A1 | * | 10/2017 | Minami | ............ H01L 21/67775 |
| 2018/0056479 A1 | * | 3/2018 | Hu | .......................... B24B 41/02 |
| 2018/0299780 A1 | | 10/2018 | Kuwahara et al. | |
| 2022/0130696 A1 | * | 4/2022 | Moura | .................... G06F 18/22 |

FOREIGN PATENT DOCUMENTS

| | | |
|---|---|---|
| JP | H06-326172 A | 11/1994 |
| JP | H11-150172 A | 6/1999 |
| JP | 2012-119370 A | 6/2012 |
| JP | 2013-062436 A | 4/2013 |
| JP | 2017-041513 A | 2/2017 |
| JP | 2017-100261 A | 6/2017 |
| JP | 2018-047419 A | 3/2018 |
| JP | 2018-182076 A | 11/2018 |
| JP | 2019-024129 A | 2/2019 |
| TW | I703666 B | 9/2020 |

* cited by examiner

SEMICONDUCTOR MANUFACTURING APPARATUS FOR IMPROVED UNIFORMITY OF SEMICONDUCTOR COATING WITH TRANSFER ARM AND POSITION DETECTOR WORKING IN COMBINATION

CROSS-REFERENCE TO RELATED APPLICATION

This application is based upon and claims the benefit of priority from Japanese Patent Application No. 2020-168342, filed Oct. 5, 2020, the entire contents of which are incorporated herein by reference.

FIELD

Embodiments described herein relate generally to a semiconductor manufacturing apparatus.

BACKGROUND

In the semiconductor device manufacturing process, a process of applying a coating liquid such as a resist liquid onto a semiconductor wafer is performed. The device for applying the coating liquid includes, for example, a wafer carrier (Front Opening Unify Pod: FOUP) that stores the semiconductor wafer, a coating unit including a spin chuck that rotates and holds the semiconductor wafer, and a nozzle that discharges the coating liquid to be applied onto the semiconductor wafer, and a transfer mechanism including a transfer arm that conveys the semiconductor wafer taken out from the wafer carrier to the coating unit. There is a process of applying the coating liquid only to the outer peripheral portion of the semiconductor wafer by using the coating device. In such a coating process, the coating width of the coating film coated on the outer peripheral portion of the semiconductor wafer may become non-uniform.

DETAILED DESCRIPTION

Embodiments provide a semiconductor manufacturing apparatus capable of improving the uniformity of the coating width of the coating liquid.

In general, according to at least one embodiment, the semiconductor manufacturing apparatus includes a substrate storage unit (storage) including a storage container configured to store a semiconductor wafer; a substrate processing unit (processor) including a rotation holding unit (holder) configured to rotate the semiconductor wafer while holding the semiconductor wafer and a coating liquid supply unit (liquid supply) configured to supply a coating liquid onto the semiconductor wafer held by the rotation holding unit; a substrate transfer unit (transferor) including a transfer arm configured to takeout the semiconductor wafer from the storage container and transfer the taken out semiconductor wafer to the rotation holding unit and a moving mechanism configured to move the transfer arm from a transfer position of the semiconductor wafer from the storage container to a transfer position of the semiconductor wafer to the rotation holding unit; and a position detection unit (detector) disposed in the vicinity of the rotation holding unit, the position detection unit being configured to detect the position of the transfer arm that holds the semiconductor wafer. In the semiconductor manufacturing apparatus of the embodiment, the moving mechanism is configured to move the transfer arm to the transfer position of the semiconductor wafer to the rotation holding unit while correcting the position of the transfer arm based on the position detection result of the transfer arm by the position detection unit.

Hereinafter, the semiconductor manufacturing apparatus of at least one embodiment will be described with reference to the drawings. In each embodiment, substantially the same parts are designated by the same reference numerals, and some of the descriptions thereof may be omitted. The drawings are schematic, and the relationship between the thickness and the plane dimensions, the ratio of the thickness of each part, and the like may differ from the actual ones.

First Embodiment

Figure 1:
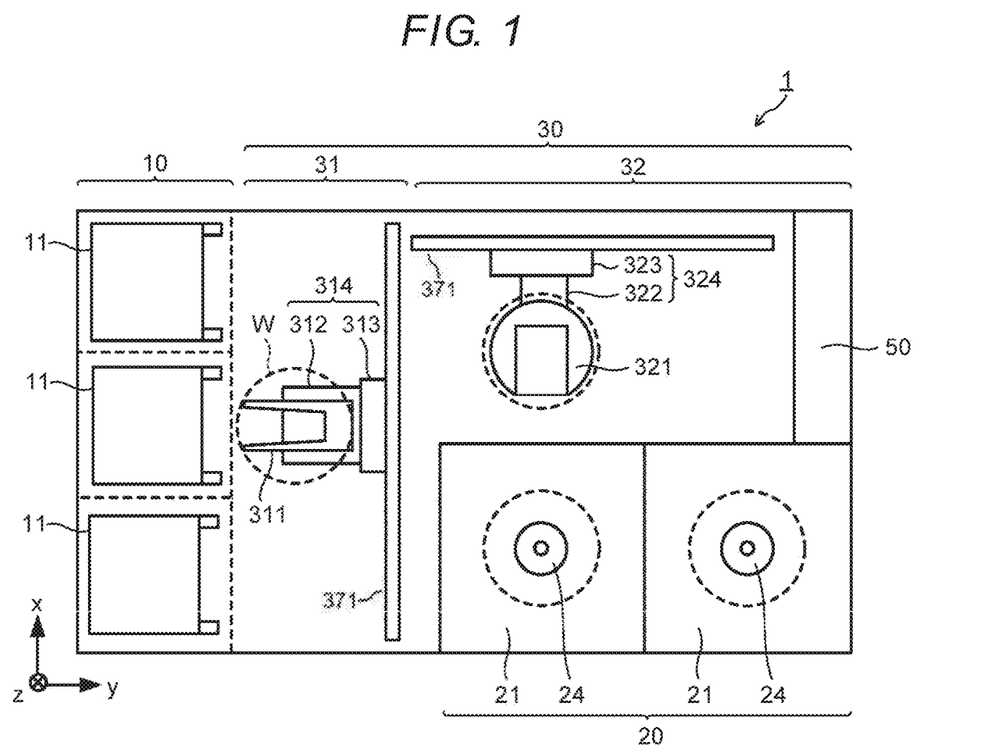
FIG. 1 is a plan view showing a schematic configuration of a coating device according to a first embodiment.
Figure 2:
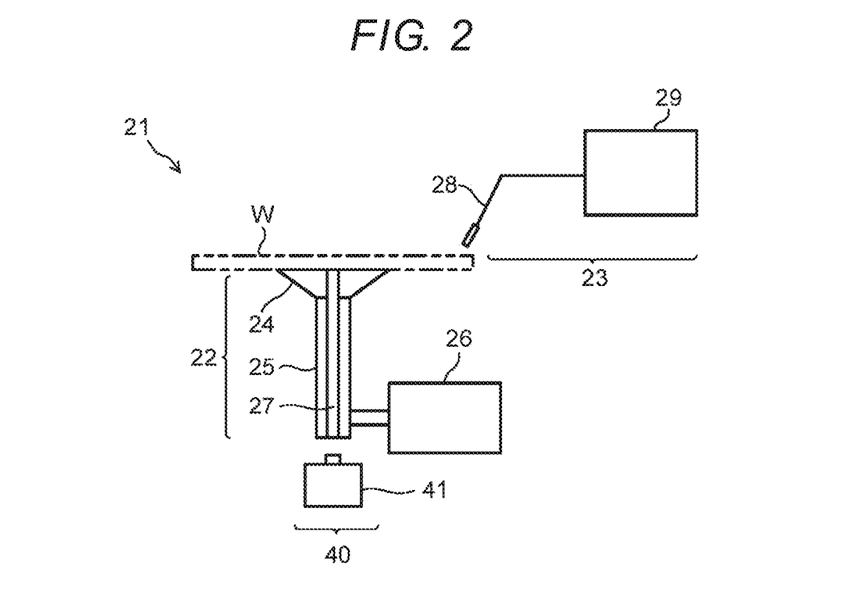
FIG. 2 is a diagram showing a substrate processing unit of the coating device shown in FIG. 1.

FIG. 1 is a plan view showing a schematic configuration of a coating device 1 to which a semiconductor manufacturing apparatus of the first embodiment is applied, and FIG. 2 is a diagram showing a substrate processing unit and a position detection unit of the coating device 1 shown in FIG. 1. The coating device 1 shown in FIGS. 1 and 2 includes a substrate storage unit 10, a substrate processing unit 20, a substrate transfer unit 30, a position detection unit 40, and a control unit 50 that controls the operation of the coating device 1.

The substrate storage unit 10 includes a storage container such as a sealed cassette (FOUP) 11 in which a plurality of semiconductor wafers W are stored. The substrate storage unit 10 includes a plurality of sealed cassettes 11, and the semiconductor wafers W taken out from the respective sealed cassettes 11 are sequentially sent to the substrate processing unit 20, and the coating process with the coating liquid is performed by the substrate processing unit 20. In FIG. 1, the arrangement direction of the sealed cassette 11 is defined as the x direction, the direction intersecting the x direction in a plane is defined as the y direction, and the direction intersecting the x direction and the y direction (vertical direction on the paper surface) is defined as the z direction.

The substrate processing unit 20 includes, for example, a plurality of substrate processing modules 21 arranged in the y direction. As shown in FIG. 2, the substrate processing module 21 includes a rotation holding unit 22 that rotates a semiconductor wafer W while holding the semiconductor wafer W, and a coating liquid supply unit 23 that supplies a coating liquid onto the semiconductor wafer W held by the rotation holding unit 22. The rotation holding unit 22 includes, for example, a spin chuck 24 that sucks and holds the semiconductor wafer W, a rotation shaft 25 connected to the spin chuck 24, and a rotation driving unit 26 such as a motor that transmits a rotation driving force to the rotation shaft 25. As will be described in detail later, a light transmission hole 27 is provided inside the spin chuck 24 and the rotation shaft 25 so that the light emitted from a light emitting unit 41 of the position detection unit 40 can pass through.

The coating liquid supply unit 23 includes a nozzle 28 that discharges the coating liquid onto the semiconductor wafer W held by the rotation holding unit 22, and a coating liquid supply tank 29 that supplies the coating liquid to the nozzle 28. When a coating film of the coating liquid is formed only on the outer peripheral portion of the semiconductor wafer W, the installation position of the nozzle 28 is adjusted so that the coating liquid is supplied to the outer peripheral portion of the semiconductor wafer W. Examples of the coating liquid include a resist liquid. However, the coating device 1 of at least one embodiment is not limited to the device used for coating the resist liquid and may be a device for applying a protective film forming liquid or the like. Further, the coating device 1 of at least one embodiment is effectively used when the coating film is formed only on the outer peripheral portion of the semiconductor wafer W but the coating device 1 is not limited thereto.

The substrate transfer unit 30 includes a first substrate transfer module 31 and a second substrate transfer module 32. The first substrate transfer module 31 includes a first transfer arm 311 that takes out the semiconductor wafer W from the sealed cassette 11, and a moving mechanism 314 including a mechanism 312 that moves the first transfer arm 311 in the y direction and a mechanism 313 that moves the first transfer arm 311 in the x direction. Although not shown, the moving mechanism 314 may include a mechanism that moves the first transfer arm 311 in the z direction in order to take out the semiconductor wafers W stored in the sealed cassette 11 in multiple stages.

When the semiconductor wafer W is taken out from the sealed cassette 11 by the first transfer arm 311, the center position of the semiconductor wafer W taken out from the sealed cassette 11 is measured by a substrate measuring mechanism (not shown), and the semiconductor wafer W is moved on the first transfer arm 311 based on the measurement result such that the center position of the semiconductor wafer W coincides with the center of the first transfer arm 311. The first substrate transfer module 31 may include a substrate table or the like that transfers the semiconductor wafer W to the second substrate transfer module 32. The first transfer arm 311 moves from the transfer position of the semiconductor wafer W from the sealed cassette 11 to the transfer position of the semiconductor wafer W to the second substrate transfer module 32.

The second substrate transfer module 32 includes a second transfer arm 321 that transfers the semiconductor wafer W received from the first substrate transfer module 31 to the spin chuck 24 of the substrate processing module 21, and a moving mechanism 324 including a mechanism 322 that moves the second transfer arm 321 in the x direction and a mechanism 323 that moves the second transfer arm 321 in the y direction. The moving mechanism 324 may include a mechanism that moves the second transfer arm 321 in the z direction. The second transfer arm 321 moves from the transfer position of the semiconductor wafer W from the first substrate transfer module 31 to the transfer position of the semiconductor wafer W to the spin chuck 24.

When the semiconductor wafer W is transferred to the spin chuck 24, the position of the second transfer arm 321 is detected by the position detection unit 40. In the coating device 1 of the first embodiment, the position detection unit 40 is provided around the spin chuck 24 of the substrate processing module 21. The position detection unit 40 is disposed in the vicinity of the rotation holding unit 22 and configured to detect the position of the second transfer arm 321 that holds the semiconductor wafer W.

Figure 3:
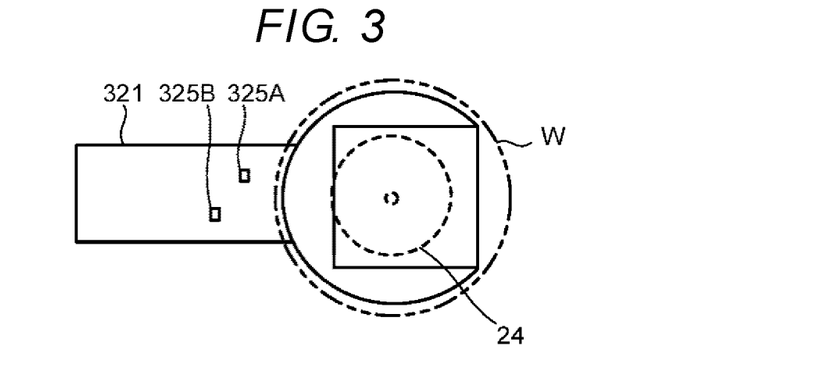
FIG. 3 is a plan view showing a transfer arm and the substrate processing unit of the coating device shown in FIG. 1.
Figure 4:
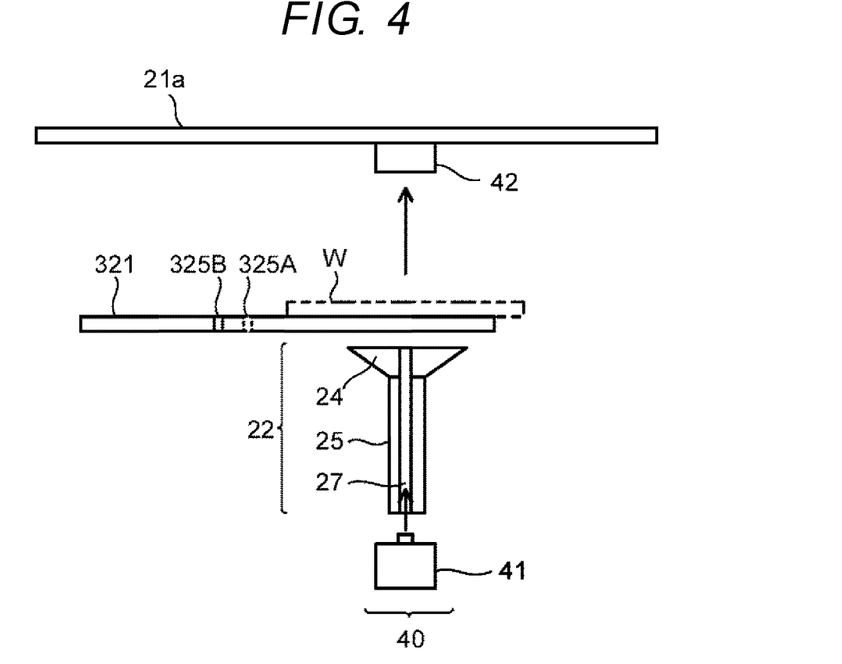
FIG. 4 is a diagram showing the transfer arm and the substrate processing unit of the coating device shown in FIG. 1.

Specifically, as shown in FIGS. 3 and 4, the position detection unit 40 includes the light transmission hole 27 provided inside the spin chuck 24 and the rotation shaft 25 described above, and first and second openings 325A and 325B provided in the second transfer arm 321, the light emitting unit 41 that irradiates the first and second openings 325A and 325B in order with light through the light transmission hole 27, and a light receiving unit 42 that receives the light passed through the first and second openings 325A and 325B. The second transfer arm 321 may be provided with at least one opening. Here, the second transfer arm 321 is provided with two openings 325A and 325B. The light receiving unit 42 is provided on a top plate 21a of the substrate processing module 21 for convenience.

As described above, when the semiconductor wafer W is taken out from the sealed cassette 11 by the first transfer arm 311, the center position of the semiconductor wafer W taken out from the sealed cassette 11 is measured by the substrate measuring mechanism. Based on the measurement result, the semiconductor wafer W is transferred such that the center position of the semiconductor wafer W coincides with the center of the first transfer arm 311. Further, even when the semiconductor wafer W is transferred from the first transfer arm 311 to the second transfer arm 321, the semiconductor wafer W is transferred such that the center position of the semiconductor wafer W coincides with the center of the second transfer arm 321. Therefore, if there is no error in the moving mechanisms of the first transfer arm 311 and the second transfer arm 321 and the like, the semiconductor wafer W will be transferred to the center position of the spin chuck 24.

However, if the moving mechanism such as the moving belts 371 of the first transfer arm 311 and the second transfer arm 321 is worn, the second transfer arm 321 and the spin chuck 24 are misaligned. Even if the second transfer arm 321 is moved so that the center position thereof coincides with the center position of the spin chuck 24, the semiconductor wafer W may not be able to be transferred to the center position of the spin chuck 24 due to the movement error of the second transfer arm 321. Further, when the coating film is formed on the entire surface of the semiconductor wafer W, the coating film can be formed approximately uniformly even if the semiconductor wafer W is held by the spin chuck 24 with some eccentricity. However, when the coating film is formed only on the outer peripheral portion of the semiconductor wafer W, if the mounting position of the semiconductor wafer W is eccentric with respect to the spin chuck 24, a coating film having a uniform coating width cannot be obtained.

Therefore, in the coating device 1 of at least one embodiment, the position of the second transfer arm 321 holding the semiconductor wafer W is detected by the position detection unit 40 immediately before the semiconductor wafer W is transferred to the spin chuck 24. If there is an error in the position of the second transfer arm 321 and the second transfer arm 321 deviates from the normal position, the second transfer arm 321 is moved with correction based on the detection result by the position detection unit 40. The movement correction of the second transfer arm 321 is performed by, for example, the control unit 50 of the entire device including the control of the movement mechanism 324 of the second substrate transfer module 32.

In this way, immediately before transferring the semiconductor wafer W to the spin chuck 24, the position of the second transfer arm 321 is detected and the movement of the second transfer arm 321 is corrected based on the detection result. Therefore, even if the moving mechanism such as the moving belts 371 of the first transfer arm 311 and the second transfer arm 321 is worn, the semiconductor wafer W can be transferred to the center position of the spin chuck 24. Even when the coating film is formed only on the outer peripheral portion of the semiconductor wafer W, a coating film having a uniform coating width can be obtained.

Figure 5:
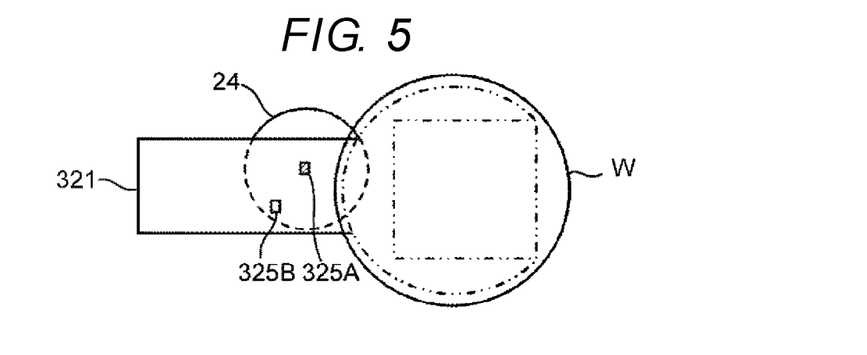
FIG. 5 is a plan view showing the transfer arm and a first process of position detection of the transfer arm by the substrate processing unit shown in FIG. 3.
Figure 6:
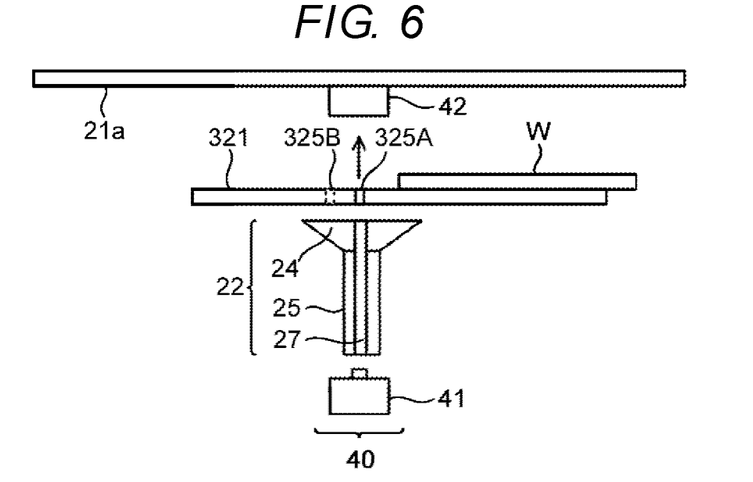
FIG. 6 is a diagram showing the transfer arm and the first process of position detection of the transfer arm by the substrate processing unit shown in FIG. 4.

The process of detecting the position of the second transfer arm 321 described above by the position detection unit 40 will be described with reference to FIGS. 5 to 8. In the coating device 1 of the first embodiment, the light emitting unit 41 and the light receiving unit 42 of the position detection unit 40 are disposed directly below and directly above the spin chuck 24. Therefore, as shown in FIGS. 5 and 6, the second transfer arm 321 passes the position directly above the spin chuck 24 and is moved such that the first opening 325A reaches directly above the center position of the spin chuck 24. At this first position, light is emitted from the light emitting unit 41, and the light that has passed through the first opening 325A is received by the light receiving unit 42, thereby measuring the amount of light that has passed through the first opening 325A (first process).

Figure 7:
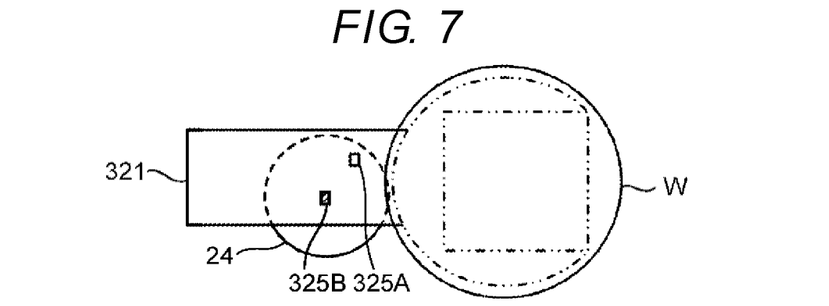
FIG. 7 is a plan view showing the transfer arm and a second process of position detection of the transfer arm by the substrate processing unit shown in FIG. 3.
Figure 8:
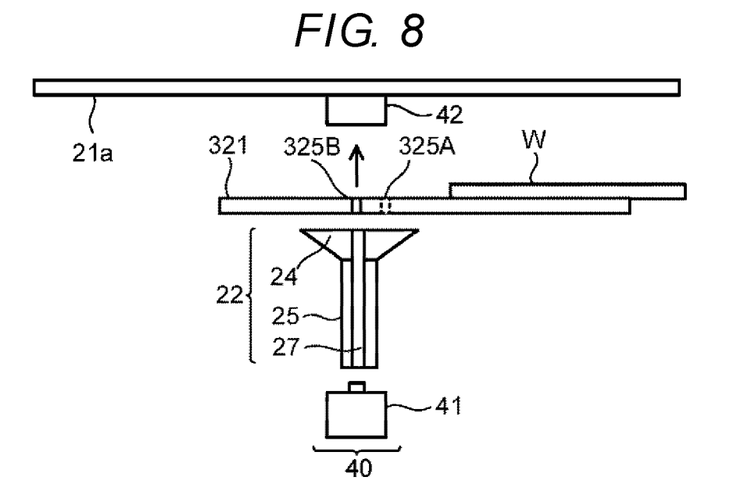
FIG. 8 is a diagram showing the transfer arm and the second process of position detection of the transfer arm by the substrate processing unit shown in FIG. 4.

Next, as shown in FIGS. 7 and 8, the second transfer arm 321 is moved such that the second opening 325B reaches directly above the center position of the spin chuck 24. At this second position, light is emitted from the light emitting unit 41, and the light that has passed through the second opening 325B is received by the light receiving unit 42, thereby measuring the amount of light that has passed through the second opening 325B (second process). The position of the second transfer arm 321 is obtained from the amount of light at the two points of the first position and the second position. The misalignment of the second transfer arm 321 is detected by comparing with the position of the second transfer arm 321 based on the amount of light between the two preset points.

Figure 9A:
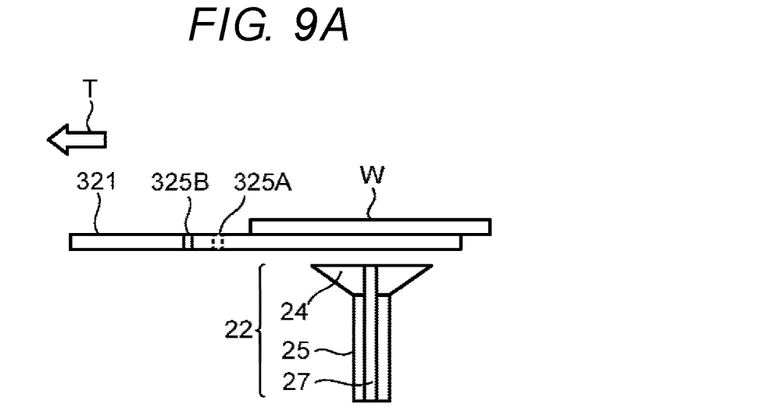
FIGS. 9A and 9B are diagrams showing a relationship between the transfer arm and the substrate processing unit after the process of position detection of the transfer arm shown in FIG. 8.
Figure 9B:
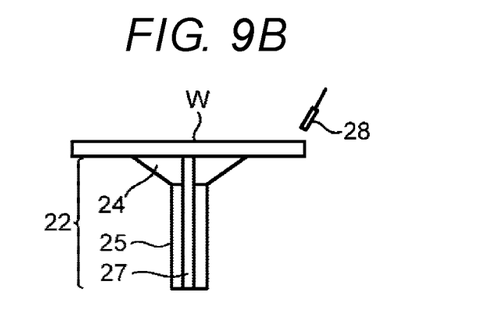

Since the second transfer arm 321 has once passed the position directly above the spin chuck 24, as shown in FIG. 9A, the second transfer arm 321 is retracted so that the center position of the second transfer arm 321 coincides with the center position of the spin chuck 24. At this time, if the second transfer arm 321 is misaligned, the second transfer arm 321 is moved while correcting the movement of the second transfer arm 321 so that the center position of the second transfer arm 321 coincides with the center position of the spin chuck 24. As a result, as shown in FIG. 9B, the semiconductor wafer W can be transferred to the center position of the spin chuck 24. In FIG. 9A, the arrow T indicates the moving direction of the second transfer arm 321.

Second Embodiment

Figure 10:
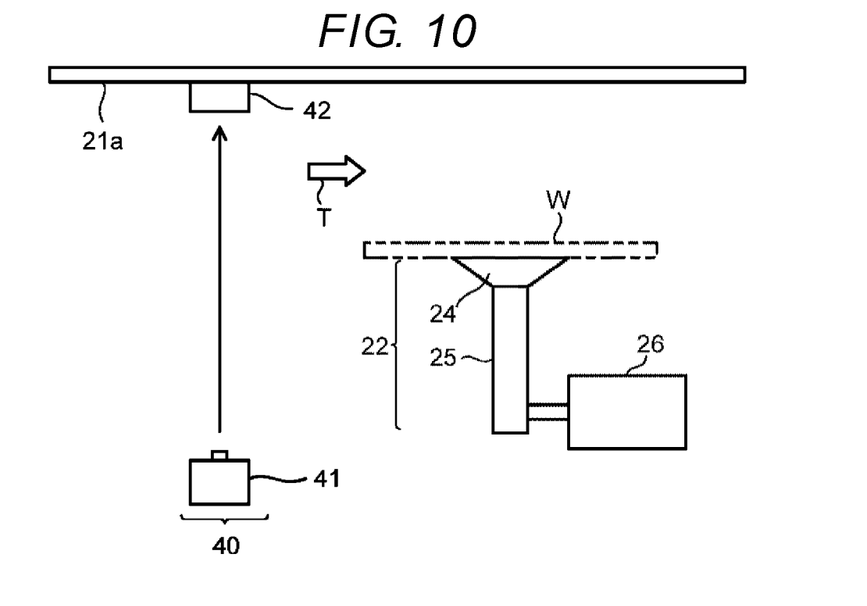
FIG. 10 is a diagram showing a transfer arm and a substrate processing unit of a coating device of a second embodiment.

The substrate processing unit 20 and the position detection unit 40 of the coating device 1 of the second embodiment are shown in FIG. 10. The coating device 1 of the second embodiment has the same configuration as the coating device 1 of the first embodiment except that the arrangement positions of the light emitting unit 41 and the light receiving unit 42 of the position detection unit 40 are different from those of the first embodiment. Although the arrangement positions of the light emitting unit 41 and the light receiving unit 42 are different, the first and second openings 325A and 325B of the second transfer arm 321 are the same as those in the first embodiment. The light emitting unit 41 and the light receiving unit 42 in the second embodiment are disposed in front of the spin chuck 24 in the moving path of the second transfer arm 321.

Figure 11:
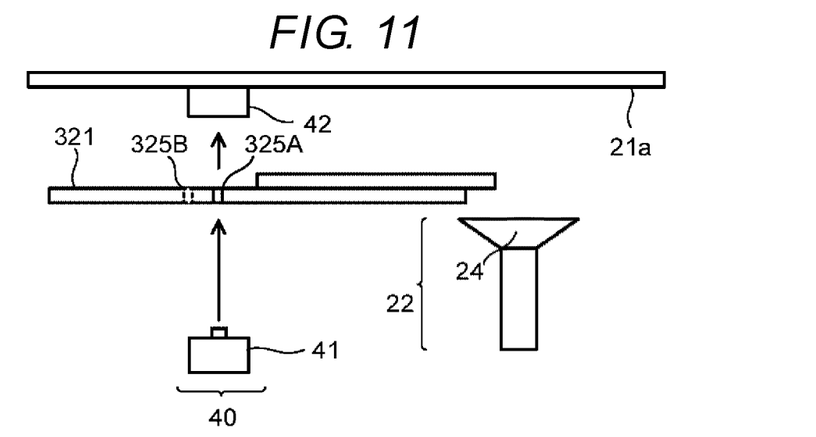
FIG. 11 is a diagram showing the transfer arm and a first process of position detection of the transfer arm by the substrate processing unit shown in FIG. 10.
Figure 12:
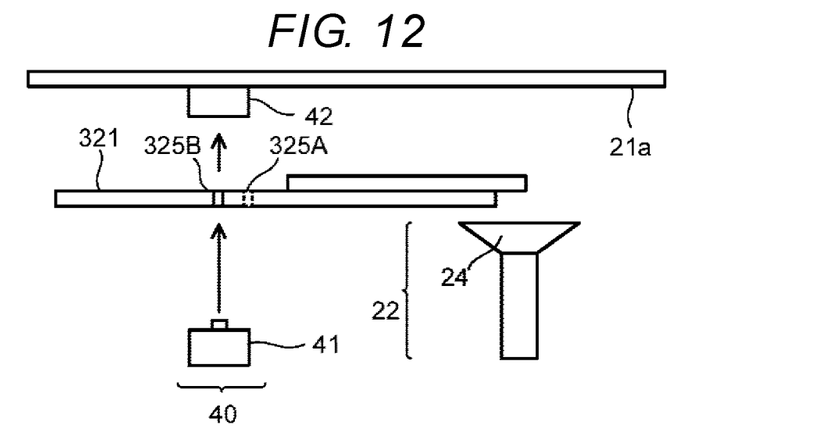
FIG. 12 is a diagram showing the transfer arm and a second process of position detection of the transfer arm by the substrate processing unit shown in FIG. 10.

Therefore, the process of detecting the position of the second transfer arm 321 by the position detection unit 40 is performed as follows, as shown in FIGS. 11 and 12. In FIG. 10, the arrow T indicates the moving direction of the second transfer arm 321. First, as shown in FIG. 11, the second transfer arm 321 is moved so that the first opening 325A reaches directly above the light emitting unit 41 before reaching above the spin chuck 24. At this first position, light is emitted from the light emitting unit 41, and the light that has passed through the first opening 325A is received by the light receiving unit 42, thereby measuring the amount of light that has passed through the first opening 325A (first process).

Next, as shown in FIG. 12, the second transfer arm 321 is moved so that the second opening 325B reaches directly above the light emitting unit 41. At this second position, light is emitted from the light emitting unit 41, and the light that has passed through the second opening 325B is received by the light receiving unit 42, thereby measuring the amount of light that has passed through the second opening 325B (second process). The position of the second transfer arm 321 is obtained from the amount of light at the two points of the first position and the second position. The misalignment of the second transfer arm 321 is detected by comparing with the position of the second transfer arm 321 based on the amount of light between the two preset points.

Figure 13A:
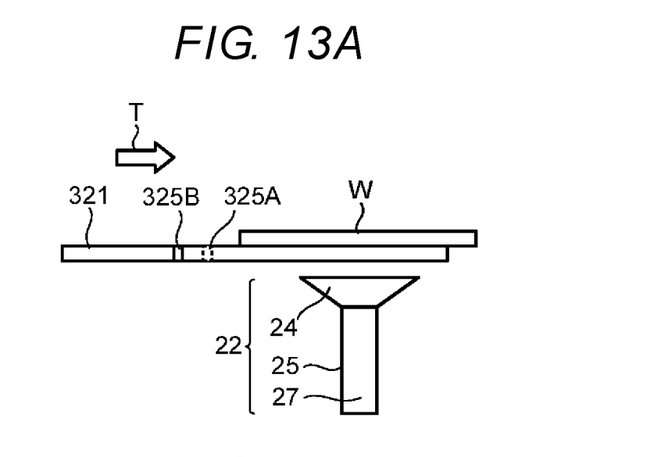
FIGS. 13A and 13B are diagrams showing a relationship between the transfer arm and the substrate processing unit after the process of detecting the position of the transfer arm shown in FIG. 12.
Figure 13B:
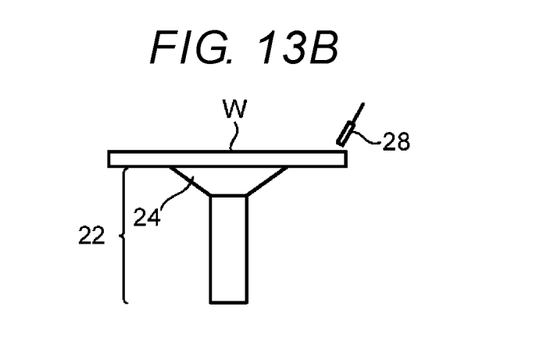

Since the position of the second transfer arm 321 is detected in front of the spin chuck 24 (in front of the moving path), as shown in FIG. 13A, the second transfer arm 321 is advanced so that the center position of the second transfer arm 321 coincides with the center position of the spin chuck 24. At this time, if the second transfer arm 321 is misaligned, the second transfer arm 321 is moved while correcting the movement of the second transfer arm 321 so that the center position of the second transfer arm 321 coincides with the center position of the spin chuck 24. As a result, as shown in FIG. 13B, the semiconductor wafer W can be transferred to the center position of the spin chuck 24.

The configurations of the above-described embodiments can be applied in combination and can be partially replaced. While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing apparatus comprising:
a substrate storage including a storage container configured to store a semiconductor wafer;
a substrate processor including:
a rotation holder configured to rotate the semiconductor wafer while holding the semiconductor wafer, a coating liquid supply configured to supply a coating liquid onto the semiconductor wafer held by the rotation holder; said rotation holder including a spin chuck;
a substrate transferor including:
a first transfer arm configured to remove the semiconductor wafer from the storage container to a second transfer arm; wherein the second arm includes a first opening and a second opening;
the second transfer arm configured to transfer the semiconductor wafer from the first transfer arm to the rotation holder in a moving path; and
a position detector configured to:
determine a first amount of light at a first position of the second transfer arm at a first preset point,
determine a second amount of light at a second position of the second transfer arm at a second preset point,
obtain a position of the second transfer arm holding the semiconductor wafer from the first amount of light at the first position and the second amount of light at the second position; and determine a position detection result indicative of a misalignment of the second transfer arm by comparing the first amount of light and the second amount of light, wherein the second transfer arm is configured to move to the second transfer arm while correcting the position of the second transfer arm based on a misalignment indicated by a position detection result of the position detector, said first opening and said second opening are located in order along the moving direction of the second transfer arm such that a light emitter is able to irradiate each of the openings as the second transfer arm moves in the moving direction towards the rotary holder;
the position detector includes:
the light emitter configured to irradiate each of the first opening at the first position and the second opening at the second position with a light, wherein said first opening is located directly above the light emitter at the first position and the second opening is located directly above the light emitter at the second position;
a light receiver configured to receive the light passed through each of the first opening and the second opening,
the light emitter and the light receiver are disposed in front of the spin chuck in the moving path of the second transfer arm, the first opening and the second opening are disposed in front of the spin chuck in the moving path of the second transfer arm;
the position of the second transfer arm is detected when the second transfer arm is in front of the spin chuck, wherein the second transfer arm is configured to advance so that a center position of the second transfer arm coincides with the center position of the spin chuck;
when misalignment of the second transfer arm is detected, the second transfer arm is moved while correcting the movement of the second transfer arm so that a center position of the second transfer arm coincides with the center position of the spin chuck.

2. The semiconductor manufacturing apparatus according to claim 1, wherein the storage container includes at least one sealed cassette.

3. The semiconductor manufacturing apparatus according to claim 1, wherein one or more moving belts are configured to move the first and second transfer arms.

4. The semiconductor manufacturing apparatus according to claim 1, wherein the first transfer arm is configured to move in a first direction and in a second direction perpendicular to the first direction.

5. The semiconductor manufacturing apparatus according to claim 4, wherein the first transfer arm is configured to move in a third direction, perpendicular to the first direction and the second direction.

* * * * *